(12) United States Patent
Oshima

(10) Patent No.: US 7,791,103 B2
(45) Date of Patent: Sep. 7, 2010

(54) GROUP III NITRIDE SEMICONDUCTOR SUBSTRATE

(75) Inventor: Yuichi Oshima, Tsuchiura (JP)

(73) Assignee: Hitachi Cable, Ltd., Tokyo (JP)

( * ) Notice: Subject to any disclaimer, the term of this patent is extended or adjusted under 35 U.S.C. 154(b) by 281 days.

(21) Appl. No.: 11/806,781

(22) Filed: Jun. 4, 2007

(65) Prior Publication Data
US 2008/0197452 A1    Aug. 21, 2008

(30) Foreign Application Priority Data
Feb. 16, 2007    (JP) .............................. 2007-035643

(51) Int. Cl.
*H01L 29/737* (2006.01)
(52) U.S. Cl. ............... 257/183; 257/615; 257/E21.117; 438/489
(58) Field of Classification Search ................ 257/615, 257/E21.117, 183; 438/489
See application file for complete search history.

(56) References Cited

U.S. PATENT DOCUMENTS 5,679,152 A * 10/1997 Tischler et al. ............. 117/97

2005/0167697 A1 * 8/2005 Flynn et al. ................. 257/194
2005/0173763 A1 * 8/2005 Takeguchi et al. .......... 257/347
2008/0169532 A1 * 7/2008 Nakahata .................... 257/615

FOREIGN PATENT DOCUMENTS

JP    2003-37288    2/2003

* cited by examiner

*Primary Examiner*—Jerome Jackson, Jr.
*Assistant Examiner*—Dale Page
(74) *Attorney, Agent, or Firm*—McGinn Intellectual Property Law Group, PLLC

(57) ABSTRACT

A Group III nitride semiconductor substrate is formed of a Group III nitride single crystal, and has a diameter of not less than 25.4 mm and a thickness of not less than 150 μm. The substrate satisfies that a ratio of $\Delta\alpha/\alpha$ is not more than 0.1, where $\alpha$ is a thermal expansion coefficient calculated from a temperature change in outside dimension of the substrate, and $\Delta\alpha$ is a difference ($\alpha-\alpha L$) between the thermal expansion coefficient $\alpha$ and a thermal expansion coefficient $\alpha L$ calculated from a temperature change in lattice constant of the substrate.

18 Claims, 8 Drawing Sheets

GROUP III NITRIDE SEMICONDUCTOR SUBSTRATE

The present application is based on Japanese patent application No. 2007-035643, the entire contents of which are incorporated herein by reference.

BACKGROUND OF THE INVENTION

1. Field of the Invention

This invention relates to a high quality Group III nitride semiconductor substrate.

2. Description of the Related Art

Recently, GaN based compound semiconductors such as gallium nitride (GaN), indium gallium nitride (InGaN), gallium aluminum nitride (AlGaN) are highlighted as materials for a blue light emitting diode (LED) and a laser diode (LD). Since the nitride semiconductor is excellent in heat resistance and environment resistance, the application of the nitride semiconductor to electronic device elements has been started.

At present, a sapphire substrate is practically and widely used as a substrate to grow the nitride semiconductor thereon, where the nitride semiconductor is in general epitaxially grown on the single crystal sapphire substrate by MOPVE (metalorganic vapor phase epitaxy) etc.

However, since the sapphire substrate has a different lattice constant from that of GaN, it is impossible to obtain a single crystal film by growing the nitride semiconductor directly on the sapphire substrate.

Further, since the MOVPE method needs a high temperature to cause a gas phase reaction, when temperature lowers after a GaN single crystal is epitaxially grown, a defect such as a warpage may be caused in the GaN due to the difference in thermal expansion coefficient between the sapphire substrate and the GaN.

JP-A-2003-37288 discloses a method that a buffer layer ("low temperature growth buffer layer") of AlN or GaN is formed on the sapphire substrate at a low temperature to relax a lattice strain therebetween, and GaN is grown on the low temperature growth buffer layer. By using the low temperature growth buffer layer, the single crystal GaN can be epitaxially grown.

However, even in the method, since the lattice mismatch between the sapphire substrate and the epitaxial growth crystal cannot be eliminated, the epitaxial GaN layer includes a number of defects. Thus, the defect becomes an obstacle to producing a GaN-based LD and a high-brightness LED.

For the above reasons, a nitride semiconductor free-standing substrate is highly desired. In case of GaN, a large ingot thereof is difficult to be grown from a melt thereof unlike in case of Si or GaAs. Therefore, various methods such as a ultrahigh temperature and pressure method, a flux method and a hydride vapor phase epitaxy (HVPE) method have been tried. Of the above methods, the HVPE method is often used to develop the GaN substrate and the substrate thus developed has been distributed in the market, although gradually. Thus, it is expected that the GaN substrate is used for a high-brightness LED and a power conversion device as well as an LD.

In the Group III nitride semiconductor device where a higher output type is expected to be developed hereafter, it is very important to suppress a vacancy defect concentration as well as a dislocation density. This is because the vacancy defect may form a complex together with the other impurity such as oxygen to exert a harmful influence on thermodynamic and optical properties of the crystal.

Although the Group III nitride semiconductor has been improved in crystalline quality by various enhancing technologies, there is still a large difference in crystalline quality between the Group III nitride semiconductor and conventional semiconductors such as Si and GaAs.

It is assumed that the Group III nitride semiconductor may have a vacancy defect concentration more than the conventional high-quality semiconductors. Since the vacancy can exist in the crystal at a certain thermodynamic equilibrium concentration, especially in case of a high-output device which is subjected to a high temperature rise in operation, there is a concern that it causes an increase in vacancy concentration more than the conventional device.

In order to reduce the vacancy defect concentration, it is necessary to rapidly measure how it changes depending on the growth method and growth condition of the crystal. The positron annihilation is known as a method for estimating the vacancy defect concentration in the crystal.

The positron annihilation can estimate the vacancy defect concentration by using a phenomenon that positrons injected into a crystal have a longer lifetime at a vacancy position where the existing probability of electron is lower than that at a normal portion.

However, the positron annihilation is not an easy-to-conduct evaluation method since a special device is required for the positron annihilation experiment. Further, since the positron annihilation is an indirect measurement method, it is not always sufficient in measurement accuracy.

Further, since the positron annihilation is an evaluation method based on a very local measurement, it is difficult to make evaluation in a large area as provided for actual crystal growth. Therefore, any research has been seldom tried which is intended to reduce the vacancy defect concentration.

SUMMARY OF THE INVENTION

It is an object of the invention to provide a Group III nitride semiconductor substrate with a high quality.

According to one aspect of the invention, a Group III nitride semiconductor substrate comprises:

a Group III nitride single crystal;

a diameter of not less than 25.4 mm; and a thickness of not less than 150 µm, wherein the substrate satisfies that a ratio of $\Delta\alpha/\alpha$ is not more than 0.1, where $\alpha$ is a thermal expansion coefficient calculated from a temperature change in outside dimension of the substrate, and $\Delta\alpha$ is a difference ($\alpha-\alpha L$) between the thermal expansion coefficient $\alpha$ and a thermal expansion coefficient $\alpha L$ calculated from a temperature change in lattice constant of the substrate.

In the above invention, the following modifications and changes can be made.

(i) The substrate further comprises:

a variation of angle defined between a principal surface and a lattice plane with a highest parallelization degree to the principal surface being not more than a center value ±0.03 degrees in the principal surface of the substrate.

(ii) The substrate further comprises:

a density of a dislocation with an edge component being not more than $2\times10^6$ cm$^{-2}$.

(iii) The substrate further comprises:

a total amount of electrically active impurities being not more than $1\times10^{19}$ cm$^{-3}$.

ADVANTAGES OF THE INVENTION

According to the invention, a Group III nitride semiconductor substrate with a high quality can be provided. Further, when fabricating an LED element by using the Group III nitride semiconductor substrate of the invention, reliability in lifetime of the LED element can be enhanced.

The invention has been devised based on findings that increase in vacancy defect concentration caused by temperature rise can be suppressed if the following conditions are satisfied: a variation in angle defined between a principal surface and a lattice plane with the highest parallelization degree to the principal surface is a center value (which means a center value calculated from the variation in angle) ±0.03 degrees or less in a principal surface of the substrate; the density of a dislocation with an edge component is not more than $2 \times 10^6$ cm$^{-2}$; and the total amount of impurities electrically active is not more than $1 \times 10^{19}$ cm$^{-3}$. The increase in vacancy defect concentration can be easily evaluated in a large area by using as an index the difference ($\Delta\alpha$) ($=\alpha-\alpha L$) between a thermal expansion coefficient (a) calculated from a temperature change in outside dimensions, i.e., a sample size, of a sample and a thermal expansion coefficient ($\alpha L$) calculated from a temperature change in lattice constant of the substrate.

According to the invention, a Group III nitride semiconductor substrate can be provided which has a small $\Delta\alpha$, i.e., rendering an increase in vacancy defect concentration caused by temperature rise significantly suppressed, and which is excellent in high temperature operating characteristics.

BRIEF DESCRIPTION OF THE DRAWINGS

The preferred embodiments according to the invention will be explained below referring to the drawings, wherein.

DETAILED DESCRIPTION OF THE PREFERRED EMBODIMENTS

Figure 1:
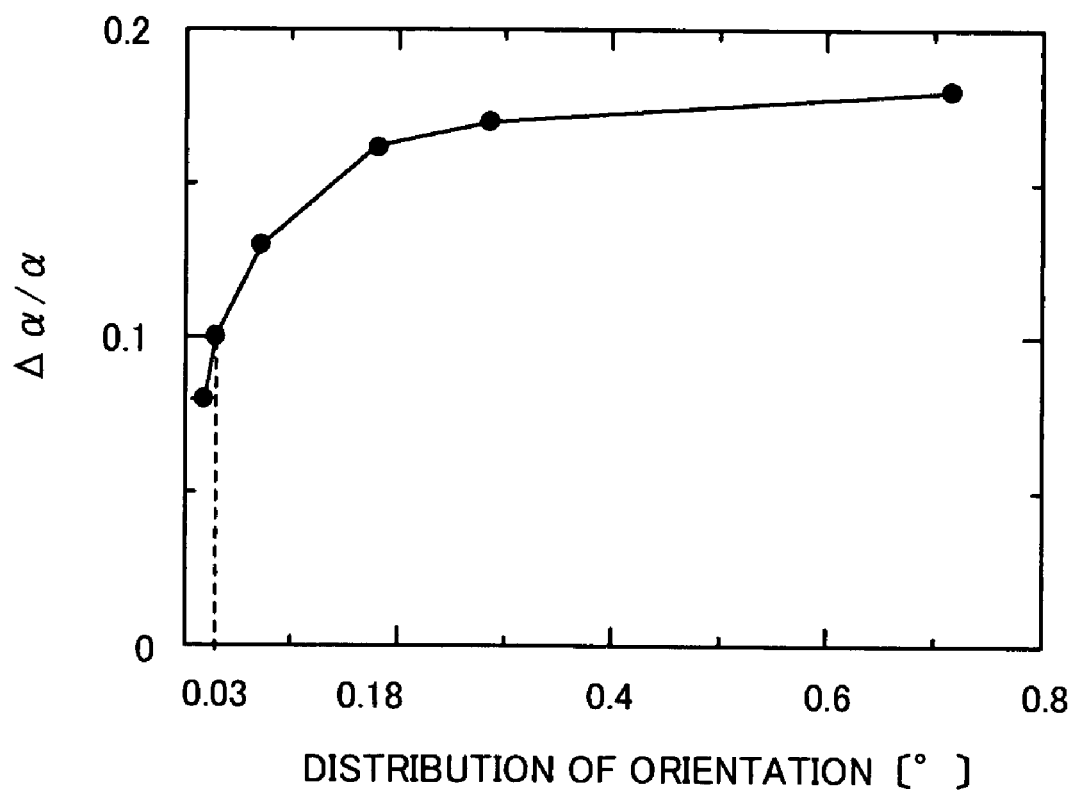
FIG. 1 is a graph showing the dependency of ratio ($\Delta\alpha/\alpha$) to C-axis orientation distribution.

The preferred embodiments according to the invention will be explained below referring to the drawings. Meanwhile, FIGS. 4 to 7 each show schematically element dimensions different from actual dimensions, since each crystal has a size extremely different from each other.

First Embodiment

Evaluation of Vacancy Defect Concentration and Ratio ($\Delta\alpha/\alpha$)

Figure 2:
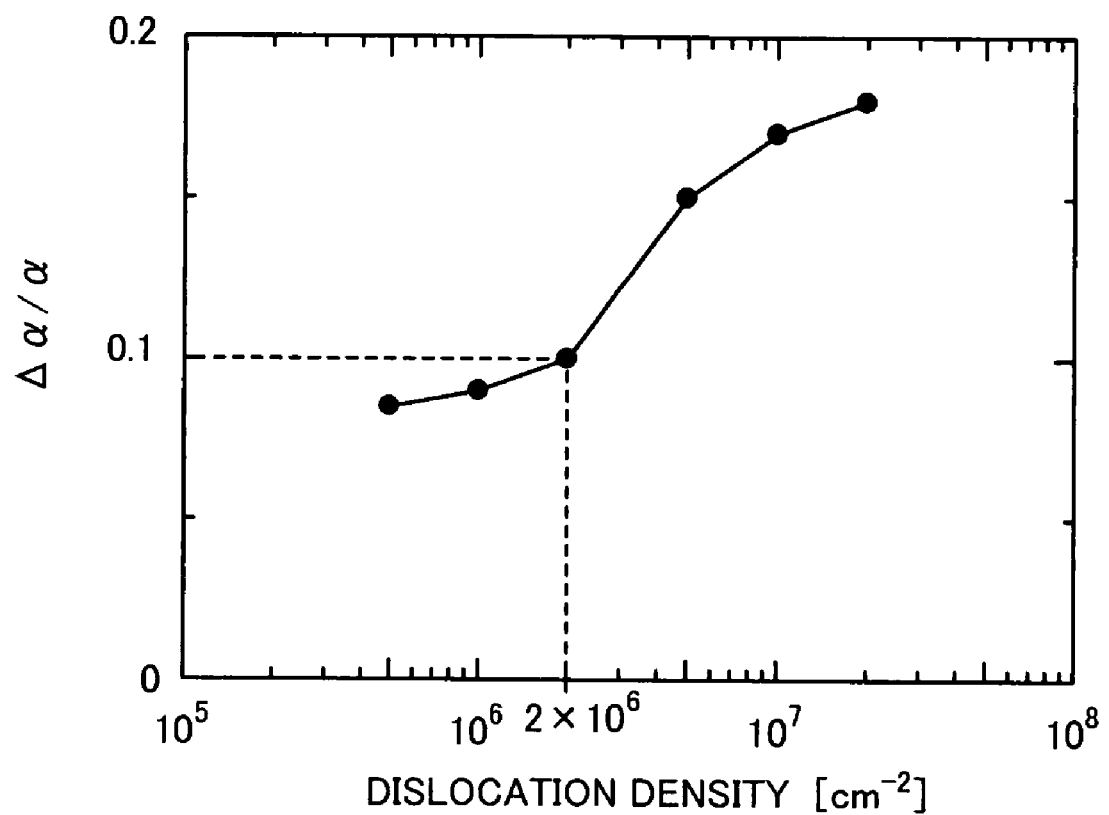
FIG. 2 is a graph showing the dependency of ratio ($\Delta\alpha/\alpha$) to the density of a dislocation with an edge component.
Figure 3:
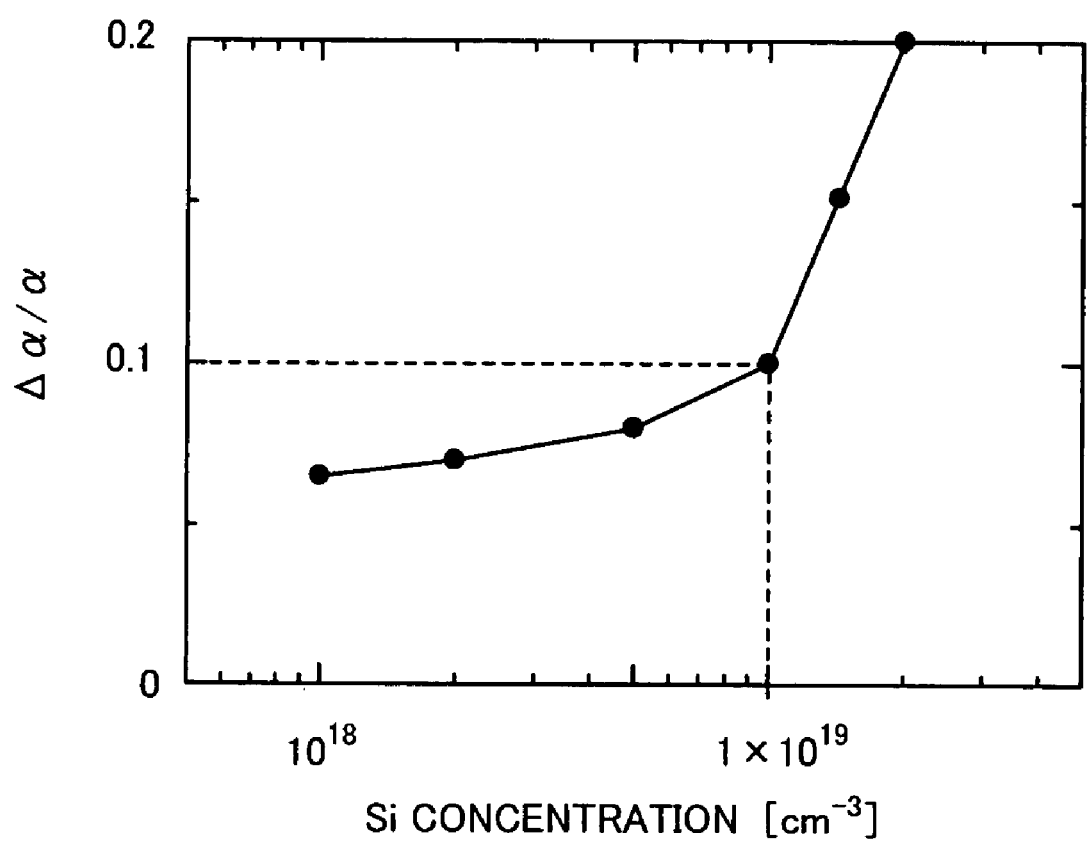
FIG. 3 is a graph showing the dependency of ratio ($\Delta\alpha/\alpha$) to the amount of impurity (Si) added.

FIG. 1 is a graph showing the measured dependency of the ratio ($\Delta\alpha/\alpha$) to C-axis orientation distribution, FIG. 2 is a graph showing the measured dependency of the ratio ($\Delta\alpha/\alpha$) to the density of a dislocation with an edge component, and FIG. 3 is a graph showing the measured dependency of the ratio ($\Delta\alpha/\alpha$) to the amount of impurity (Si) added.

As mentioned earlier, one possible method for measuring the vacancy defect concentration is the positron annihilation. However, the vacancy defect concentration cannot be easily evaluated by the positron annihilation since the positron annihilation experiment needs a special device.

Thus, a method for easily evaluating the vacancy defect concentration in a large area will be explained below. The method uses as an index a difference ($\Delta\alpha$) ($=\alpha-\alpha L$) between a thermal expansion coefficient ($\alpha$) calculated from a temperature change in sample size, and a thermal expansion coefficient ($\alpha L$) calculated from a temperature change in lattice constant of the substrate.

Generally, the thermal expansion of a substance can be caused by an increase in distance between lattices and an increase in thermodynamic equilibrium concentration of the vacancy. It is assumed that the thermal expansion coefficient ($\alpha$) obtained from a temperature change in sample size includes both information as described above. The thermal expansion coefficient ($\alpha$) can be obtained by directly measuring the temperature change in sample size by means of the TMA (Thermal Mechanical Analysis) method or the laser interference method.

The TMA method is a method for detecting a difference in thermal expansion between a reference sample such as quartz glass and a measured sample by a differential transformer.

On the other hand, when the thermal expansion coefficient ($\alpha L$) can be estimated from the temperature change in lattice constant by the X-ray diffraction or electron diffraction, the information of increase in vacancy defect concentration is not included therein. Therefore, by considering the difference ($\Delta\alpha = \alpha - \alpha L$) between the coefficient ($\alpha$) and the coefficient ($\alpha L$), the influence of increase in vacancy defect concentration can be extracted.

Until now, the measurement of the coefficient ($\alpha L$) has been difficult since a large crystal of the Group III nitride semiconductor is not realized and, therefore, it is difficult to measure the coefficient ($\alpha L$) with high accuracy. Namely, no index has been available for the vacancy defect concentration so that it was difficult to improve the vacancy defect concentration.

However, in recent years, a large GaN crystal (wafer) with a diameter of 50.8 mm (2 inches) or more has been developed by the HVPE method. Under the circumstances, the inventor addressed the measurement of the coefficient ($\alpha L$) and made research to reduce efficiently the difference ($\Delta\alpha$). As the result of keen researches, it has been found that the following measures are effective although the physical mechanism is not thoroughly clarified.

(1) Decrease in Macro Stress

Generally, GaN substrate produced by the HVPE method includes a warpage with Ga polar surface inside. It is assumed that the warpage is caused by internal stress due to a change in grain boundary density of crystal at the early growth stage.

FIG. 1 is a graph obtained by plotting the ratio ($\Delta\alpha/\alpha$) to the curvature radius of GaN substrate warpage, i.e., a variation (orientation distribution) of angle defined between a principal surface and a lattice plane with the highest parallelization degree to the principal surface. In this case, the density of a dislocation with an edge component is set to be a constant value of $2 \times 10^6$ cm$^{-2}$ and the total amount of electrically active impurities is set to a constant value of $1 \times 10^{19}$ cm$^{-3}$. It was found that there is a tendency that the ratio ($\Delta\alpha/\alpha$) decreases by reducing the warpage to decrease the internal stress.

Generally, a GaN substrate is polished at both surfaces thereof before use. Thereby, the outer shape is planarized but the warpage of lattice plane is still left. Therefore, the angle defined between the principal surface and the lattice plane of the GaN substrate varies depending on the in-plane position of the GaN substrate. According as the warpage before the polishing decreases, the variation of the angle decreases. Thus, the ratio ($\Delta\alpha/\alpha$) can be remarkably reduced by decreasing the warpage (internal stress), i.e., by controlling a variation of the angle defined between the principal surface of the GaN substrate after the polishing and the lattice plane with the highest parallelization degree to the principal surface to be a center value ±0.03 degrees in terms of the in-plane GaN substrate.

(2) Decrease in Micro Stress

There is a cause of stress that may contribute to the occurrence of vacancies other than the "macro stress" as described above. It is the existence of a dislocation with an edge component. It is assumed that a stress field inversely proportional to the distance from a dislocation core exists on the periphery of the edge dislocation, and that it contributes to an increase in vacancy defect concentration.

FIG. 2 is a graph obtained by plotting the ratio ($\Delta\alpha/\alpha$) to the density of a dislocation with an edge component. In this case, the orientation distribution is set to be a constant value of a center value ±0.03 degrees in terms of the in-plane GaN substrate, and the total amount of electrically active impurities is set to be a constant value of $1\times10^{19}$ cm$^{-3}$. It was found that as the dislocation density decreases, the ($\Delta\alpha/\alpha$) decreases, and that a remarkable effect can be obtained when the dislocation density is not more than $2\times10^6$ cm$^{-2}$.

(3) Suppression of the Total Amount of Electrically Active Impurities

Generally, an n-type impurity is added to a GaN substrate to obtain a sufficient conductivity. The impurity typically includes Si, Ge, and O. It is known that when the electrically active impurity are added, the formation energy of vacancies in the GaN substrate lowers due to a demand for neutralization condition of electrical charge, so that the vacancies can be easy formed even at a low energy.

FIG. 3 is a graph obtained by plotting the ratio ($\Delta\alpha/\alpha$) to the amount of Si added. In this case, the orientation distribution is set to be a constant value of a center value ±0.03 degrees in terms of the in-plane GaN substrate, and the density of a dislocation with an edge component is set to be a constant value of $2\times10^6$ cm$^{-2}$. it was found that according as the Si concentration increases, the ($\Delta\alpha/\alpha$) increases, and that a Si concentration of not more than $1\times10^{19}$ cm$^{-3}$ is effective to suppress the increase of ($\Delta\alpha/\alpha$).

COMPARATIVE EXAMPLE

Figure 4:
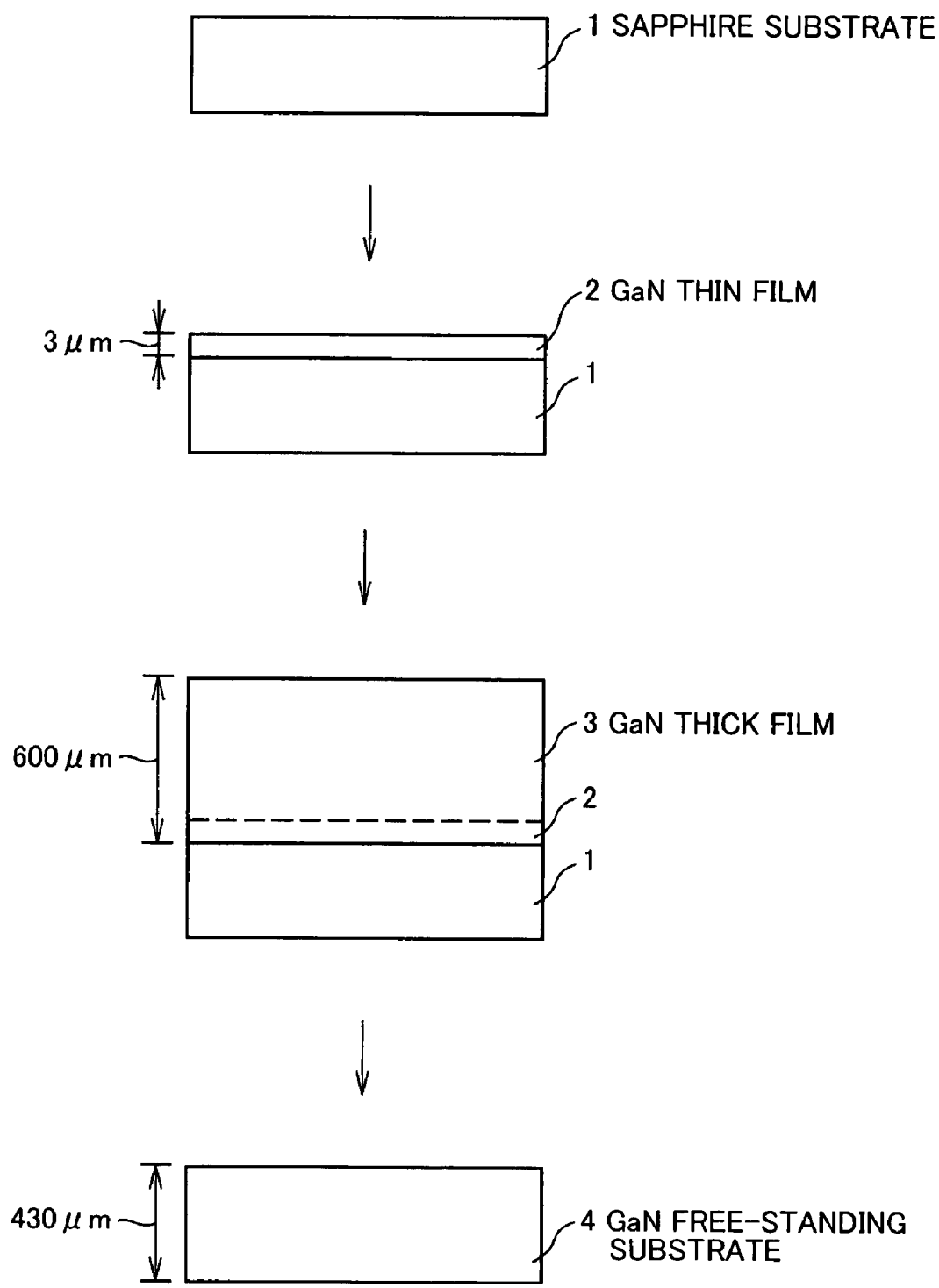
FIG. 4 is a schematic cross sectional view showing a method for making a GaN substrate in Comparative Example.

FIG. 4 is a schematic cross sectional view showing a method for making a GaN substrate in Comparative Example.

A GaN thin film 2 was epitaxially grown on a C-face sapphire substrate 1 of 2 inches in diameter to have a thickness of 3 μm by MOVPE (metalorganic vapor phase epitaxy). Then, the GaN thin film 2 with the sapphire substrate 1 was placed in an HVPE (hydride vapor phase epitaxy) reactor, where it was epitaxially grown to have a GaN thick film 3 with a thickness of 600 μm by using GaCl and NH$_3$ as raw materials. The growth temperature was set 1073° C., and the growth pressure was set 97 kPa. SiH$_2$Cl$_2$ gas was added as a raw material gas at a rate of 0.6 μmol/min to have a Si doped crystal.

The GaN thick film 3 epitaxially grown on the sapphire substrate 1 was separated from the sapphire substrate 1 by laser separation and polished at both surfaces thereof, whereby a GaN free-standing substrate 4 with a diameter of 2 inches and a thickness of 430 μm was obtained as a first GaN substrate.

The C-axis in-plane variation of the GaN free-standing substrate 4 was determined as large as a center value ±0.18 degrees by X-ray diffraction.

Further, the Si concentration in the crystal was determined $1.5\times10^{19}$ cm$^{-3}$ by SIMS analysis.

Furthermore, the density of a dislocation with an edge component was estimated $1\times10^7$ cm$^{-2}$ from (10-10) X-ray rocking curve.

On the other hand, in the measurement of the thermal expansion coefficient by TMA method and X-ray diffraction method, the ratio ($\Delta\alpha/\alpha$) of the GaN free-standing substrate 4 was estimated about 0.15.

Figure 5:
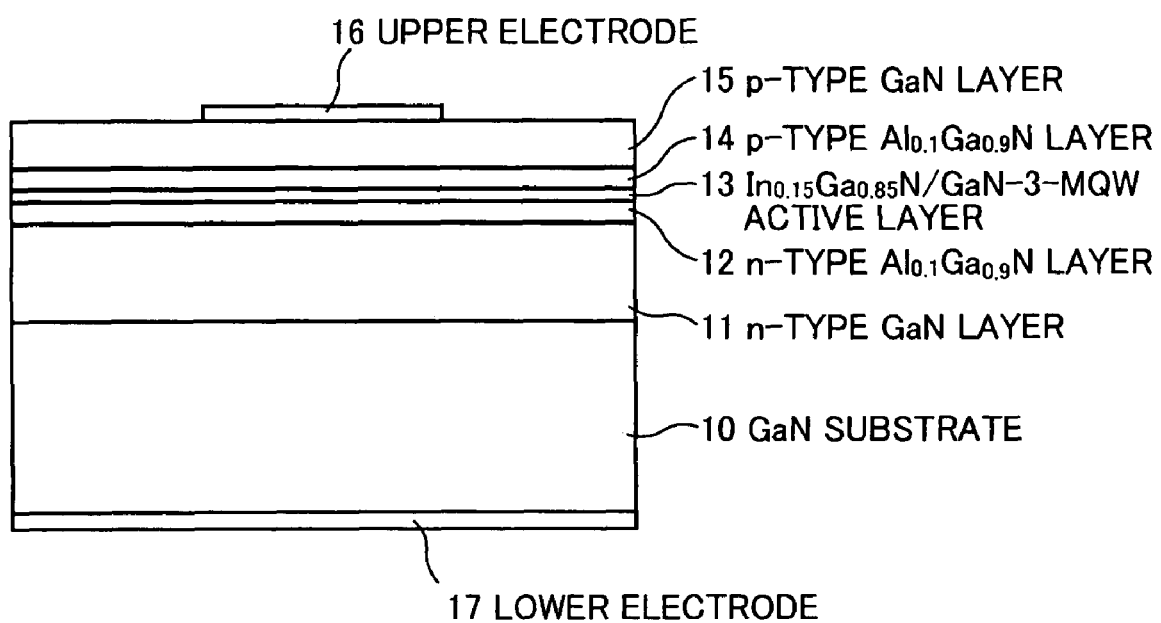
FIG. 5 is a schematic cross sectional view showing an LED element fabricated by using a free-standing substrate 4 made by the method for making the GaN substrate as shown in FIG. 4.

FIG. 5 is a schematic cross sectional view showing an LED element fabricated by using the free-standing substrate 4 which is produced by the method for making the GaN substrate as explained in FIG. 4.

The GaN free-standing substrate 4 was placed in the MOVPE reactor again as a GaN substrate 10. Then, on the GaN substrate 10, the following layers were epitaxially grown by MOVPE: a 4 μm thick n-type GaN layer 11; a 40 nm thick n-type Al$_{0.1}$Ga$_{0.9}$N layer 12; a 13 nm thick In$_{0.15}$Ga$_{0.85}$N/GaN-3-MQW active layer 13 (with 3 nm well layers and 10 nm barrier layers); a 40 nm thick p-type Al$_{0.1}$Ga$_{0.9}$N layer 14; and a 500 nm thick p-type GaN layer 15.

The epi-wafer epitaxially grown was cut into 0.3 mm square chips, an upper electrode 16 and a lower electrode 17 were formed on the upper and lower surfaces, respectively, the 0.3 mm square chip was mounted onto a stem with a silver paste, and wire-bonding and resin sealing were conducted, whereby an LED element was obtained.

As the result of a reliability test with 100 mA current, it was estimated that the LED element has a lifetime of about 4000 hours. It is assumed that the short lifetime is caused by many vacancies generated with the temperature rise during the high current operation, whereby the thermal conductivity decreases and the optical absorption coefficient increases.

Production Method of GaN Substrate in the First Embodiment

Figure 6:
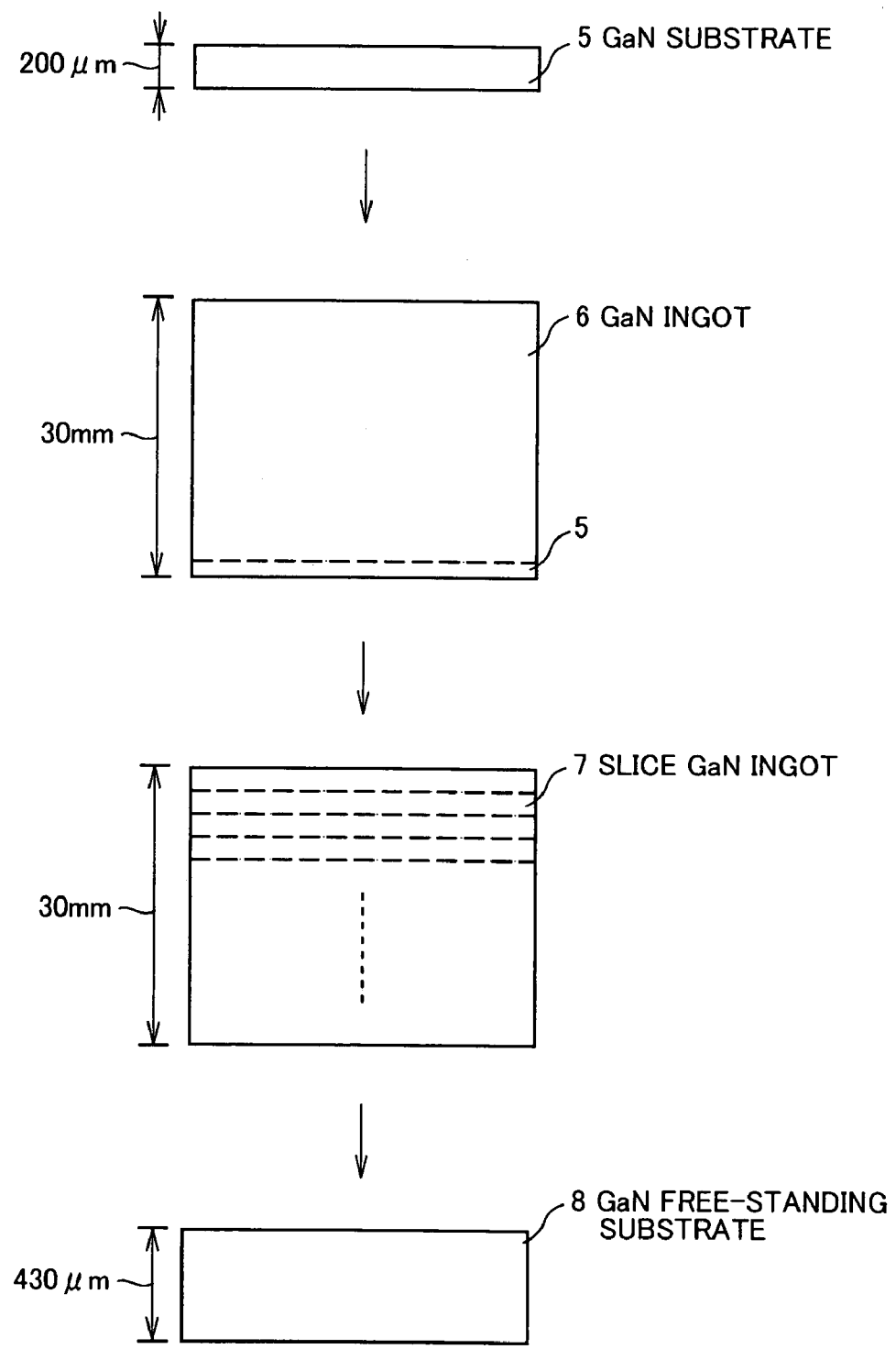
FIG. 6 is a schematic cross sectional view showing a method for making a GaN substrate in a first preferred embodiment according to the invention.

FIG. 6 is a schematic cross sectional view showing a method for making a GaN substrate in the first preferred embodiment according to the invention.

A GaN substrate, which is a seed substrate used in the method of making the GaN substrate of the first embodiment, was produced as follows. As shown in FIG. 4, a GaN thin film was epitaxially grown on a C-face sapphire substrate 1 of 2 inches in diameter to have a thickness of 3 μm by the MOVPE, and the GaN thin film with the sapphire substrate 1 was placed in the HVPE reactor, where the GaN thin film was epitaxially grown to have a GaN thick film 3 with a thickness of 600 μm by using GaCl and NH$_3$ as raw materials. The growth temperature was set 1073° C., and the growth pressure was set 97 kPa. SiH$_2$Cl$_2$ gas was added as a raw material gas at a rate of 0.6 μmol/min to obtain a Si doped crystal. So far, the same process as Comparative Example was used.

Then, the GaN thick film 3 epitaxially grown on the sapphire substrate 1 was separated from the sapphire substrate 1 by laser separation, and polished at both surfaces thereof, whereby a GaN substrate with a diameter of 50.8 mm and a thickness of 200 μm was obtained. The GaN substrate was used as a GaN substrate 5, a seed substrate.

The GaN substrate 5 was placed in the HVPE reactor again, where it is further epitaxially grown to have a thickness of 30 mm. A single crystal GaN ingot 6 thus obtained was sliced to have a slice GaN ingot 7, and the slice GaN ingot 7 is used as a GaN free-standing substrate 8 (i.e., a second GaN substrate) with a diameter of 2 inches and a thickness of 430 μm.

The in-plane variation of the GaN free-standing substrate 8 sliced from a top portion of the ingot was measured as small as a center value ±0.01 degree by the X-ray diffraction method.

Further, the Si concentration in the crystal was measured $1.0 \times 10^{18}$ cm$^{-3}$ by SIMS analysis.

Furthermore, the density of a dislocation with an edge component was estimated was $1 \times 10^5$ cm$^{-2}$ from (10-10) X-ray rocking curve.

On the other hand, in the measurement of the thermal expansion coefficient by TMA method and X-ray diffraction method, the ratio ($\Delta\alpha/\alpha$) of the GaN free-standing substrate 8 was estimated less than 0.01 (i.e., measurement lower limit).

LED Element in the First Embodiment

Figure 7:
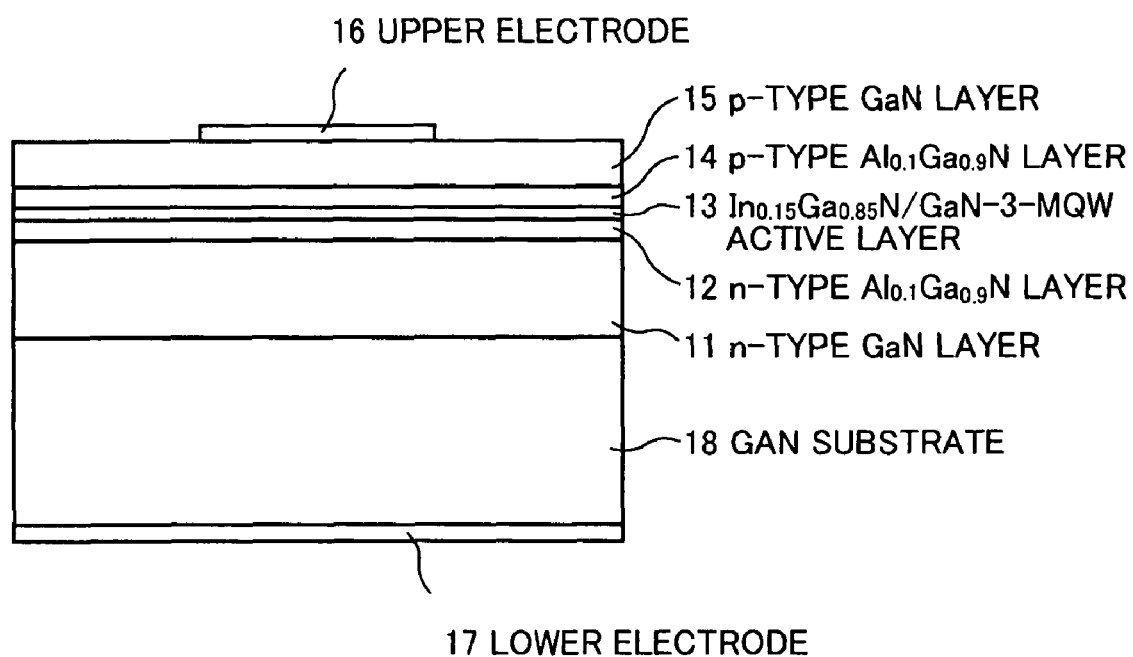
FIG. 7 is a schematic cross sectional view showing an LED element structure in the first preferred embodiment according to the invention.

FIG. 7 is a schematic cross sectional view showing an LED element structure in the first embodiment, where the LED element is fabricated by using the GaN free-standing substrate 8.

In fabricating an LED element with the same structure as shown in FIG. 5 (Comparative Example), the GaN free-standing substrate 8 as a GaN substrate 18 was placed in the MOVPE reactor again. Then, on the GaN substrate 18, the following layers were epitaxially grown by MOVPE: a 4 μm thick n-type GaN layer 11; a 40 nm thick n-type Al$_{0.1}$Ga$_{0.9}$N layer 12; a 13 nm thick In$_{0.15}$Ga$_{0.85}$N/GaN-3-MQW active layer 13 (with 3 nm well layers and 10 nm barrier layers); a 40 nm thick p-type Al$_{0.1}$Ga$_{0.9}$N layer 14; and a 500 nm thick p-type GaN layer 15. In FIG. 7, like components are indicated by the same numerals as used in FIG. 5.

The epi-wafer epitaxially grown was cut into 0.3 mm square chips, an upper electrode 16 and a lower electrode 17 were formed on the upper and lower surfaces, respectively, the 0.3 mm square chip was mounted onto a stem with a silver paste, and wire-bonding and resin sealing were conducted, whereby an LED element was obtained.

As the result of a reliability test with 100 mA current, it was estimated that the LED element has a lifetime of about 11000 hours. It is assumed that the long lifetime is caused by reduced vacancies generated with the temperature rise during the high current operation, whereby deterioration of the thermal conductivity and the optical absorption coefficient can be suppressed.

Advantages of the First Embodiment

According to the first embodiment, the high-quality GaN free-standing substrate can be obtained in which the increase of the vacancy defect concentration is suppressed even at a high temperature, under the conditions that the orientation distribution is not more than a center value ±0.03 degrees in the principal surface of the GaN substrate, the dislocation density is not more than $1 \times 10^6$ cm$^{-2}$, and the total amount of impurities is not more than $1 \times 10^{19}$ cm$^{-3}$. By using the GaN free-standing substrate, in particular, a nitride semiconductor device, such as LED and LD, driven by a large current can be remarkably improved in operation efficiency and lifetime.

Second Embodiment

Figure 8:
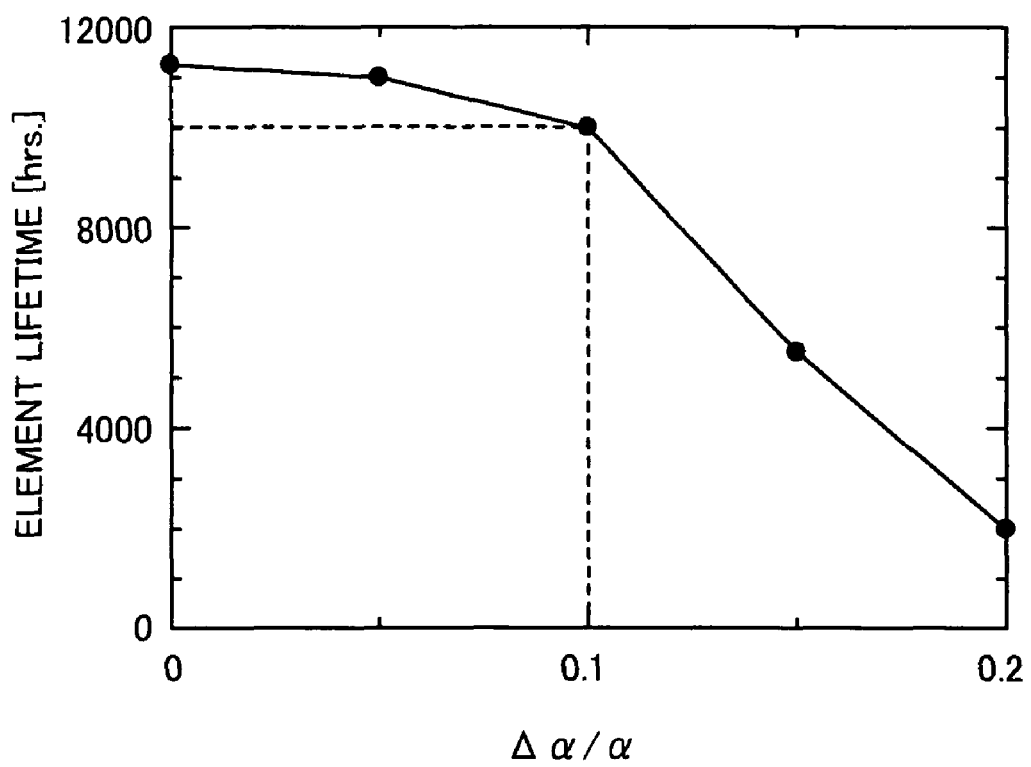
FIG. 8 is a graph showing the dependency of the lifetime of an LED element in a second preferred embodiment according to the invention, to ratio ($\Delta\alpha/\alpha$)

FIG. 8 is a graph showing the dependency of LED element lifetime in the second preferred embodiment according to the invention, to the ratio ($\Delta\alpha/\alpha$).

The plural GaN free-standing substrates 8 obtained by the first embodiment as shown in FIG. 6 have different values of ($\Delta\alpha/\alpha$) depending on the position where to be sliced from the GaN ingot 6. FIG. 8 shows the result of a reliability test of LED elements with the same structure as the first embodiment fabricated by using the substrates 8, whereby it was found that according as the ratio ($\Delta\alpha/\alpha$) decreases, the reliability of the LED element can be enhanced, and that, in case of ($\Delta\alpha/\alpha$) less than about 0.1, 10000 hours can be attained in actual lifetime. Thus, it is evidenced that the plural GaN free-standing substrates 8 can all have high practical utility and high quality.

Other Embodiments

Although the invention has been described with respect to the specific embodiments for complete and clear disclosure, the appended claims are not to be thus limited but are to be construed as embodying all modifications and alternative constructions that may occur to one skilled in the art which fairly fall within the basic teaching herein set forth.

For example, although in the above embodiments the case of LED element was explained, the invention is not particularly limited to them and can also achieve the same effects in devices which need a high-output operation such as an LD and a power conversion element. Further, the GaN free-standing substrate 8 may be produced by flux method and ammono-thermal method etc. other than the HVPE method as explained above.

What is claimed is:

1. A Group III nitride semiconductor substrate, comprising:
    a Group III nitride single crystal;
    a diameter of not less than 25.4 mm;
    a variation of angle defined between a principal surface and a lattice plane with a highest parallelization degree to the principal surface being not more than a center value ±0.03 degrees in the principal surface of the substrate; and
    a thickness of not less than 150 μm,
    wherein the substrate satisfies that a ratio of $\Delta\alpha/\alpha$ is not more than 0.1, where $\alpha$ is a thermal expansion coefficient of an outer portion of the substrate, and $\Delta\alpha$ is a difference ($\alpha$–$\alpha$L) between the thermal expansion coefficient a and a thermal expansion coefficient $\alpha$L of a lattice constant of the substrate.

2. The Group III nitride semiconductor substrate according to claim 1, further comprising:
    a density of a dislocation with an edge component being not more than $2 \times 10^6$ cm$^{-2}$.

3. The Group III nitride semiconductor substrate according to claim 1, further comprising:
    a total amount of electrically active impurities being not more than $1 \times 10^{19}$ cm$^{-3}$.

4. A method of making a Group III nitride semiconductor substrate, comprising:
    forming said Group III nitride semiconductor substrate from a Group III nitride single crystal, said Group III nitride semiconductor substrate having a diameter of not less than 25.4 mm and a thickness of not less than 150 μm, and satisfying that a ratio of $\Delta\alpha/\alpha$ is not more than 0.1, where a is a thermal expansion coefficient of an outer portion of the substrate, and $\Delta\alpha$ is a difference $(\Delta-\Delta L)$ between the thermal expansion coefficient a and a thermal expansion coefficient $\Delta L$ of a lattice constant of the substrate, wherein said Group III nitride semiconductor substrate has a variation of angle defined between a principal surface and a lattice plane with a highest parallelization degree to the principal surface being not more than a center value ±0.03 degrees in the principal surface of the substrate.

5. The method of making a Group III nitride semiconductor substrate according to claim 4, wherein said Group III nitride semiconductor substrate has a density of a dislocation with an edge component being not more than $2\times10^6$ cm$^{-2}$.

6. The method of making a Group III nitride semiconductor substrate according to claim 4, wherein said Group III nitride semiconductor substrate has a total amount of electrically active impurities being not more than $1\times10^{19}$ cm$^{-3}$.

7. The method of making a Group III nitride semiconductor substrate according to claim 4, further comprising:
    forming a Group III nitride semiconductor thin film on a C-face sapphire substrate;
    separating said Group III nitride semiconductor thin film from said C-face sapphire substrate; and
    forming said Group III nitride single crystal on said Group III nitride semiconductor thin film.

8. The method of making a Group III nitride semiconductor substrate according to claim 7, wherein said forming said Group III nitride single crystal comprises growing said Group III nitride single crystal on said Group III nitride semiconductor thin film.

9. The method of making a Group III nitride semiconductor substrate according to claim 4, wherein said forming said Group III nitride semiconductor substrate comprises slicing a portion from said Group III nitride single crystal to form said Group III nitride semiconductor substrate.

10. A method of making an LED element, comprising:
    forming a Group III nitride semiconductor substrate from a Group III nitride single crystal, said Group III nitride semiconductor substrate having a diameter of not less than 25.4 mm and a thickness of not less than 150 μm, and satisfying that a ratio of $\Delta\alpha/\alpha$ is not more than 0.1, where $\alpha$ is a thermal expansion coefficient of an outer portion of the substrate, and $\Delta\alpha$ is a difference $(\alpha-\alpha L)$ between the thermal expansion coefficient $\alpha$ and a thermal expansion coefficient $\alpha L$ of a lattice constant of the substrate;
    sequentially forming an n-type GaN layer, an n-type AlGaN layer, an InGaN/GaN-3-MQW active layer, a p-type AlGaN layer, and a p-type GaN layer on said Group III nitride semiconductor substrate; and
    forming an upper electrode on said p-type GaN layer and a lower electrode on said Group III nitride semiconductor substrate, wherein said Group III nitride semiconductor substrate has a variation of angle defined between a principal surface and a lattice plane with a highest parallelization degree to the principal surface being not more than a center value ±0.03 degrees in the principal surface of the substrate.

11. The method of making an LED element according to claim 10, wherein said n-type AlGaN layer comprises an n-type $Al_{0.1}Ga_{0.9}N$ layer,
    wherein said InGaN/GaN-3-MQW active layer comprises an $In_{0.15}Ga_{0.85}N$/GaN-3-MQW layer, and
    wherein said p-type AlGaN layer comprises a p-type $Al_{0.1}Ga_{0.9}N$ layer.

12. The method of making an LED element according to claim 10, wherein said Group III nitride semiconductor substrate has a density of a dislocation with an edge component being not more than $2\times10^6$ cm$^{-2}$.

13. The method of making an LED element according to claim 10, wherein said Group III nitride semiconductor substrate has a total amount of electrically active impurities being not more than $1\times10^{19}$ cm$^{-3}$.

14. The method of making an LED element according to claim 10, further comprising:
    forming a Group III nitride semiconductor thin film on a C-face sapphire substrate;
    separating said Group III nitride semiconductor thin film from said C-face sapphire substrate; and
    forming said Group III nitride single crystal on said Group III nitride semiconductor thin film.

15. The method of making an LED element according to claim 14, wherein said forming said Group III nitride single crystal comprises growing said Group III nitride single crystal on said Group III nitride semiconductor thin film.

16. The method of making an LED element according to claim 10, wherein said forming said Group III nitride semiconductor substrate comprises slicing a portion from said Group III nitride single crystal to form said Group III nitride semiconductor substrate.

17. The Group III nitride semiconductor substrate according to claim 1, further comprising:
    a total amount of electrically active impurities being in a range from $1\times10^{18}$ cm$^{-3}$ to $1\times10^{19}$ cm$^{-3}$.

18. The Group III nitride semiconductor substrate according to claim 1, further comprising:
    a density of a dislocation with an edge component being in a range from $5\times10^5$ cm$^{-2}$ to $2\times10^6$ cm$^{-2}$.

* * * * *